United States Patent
Ohido et al.

(10) Patent No.: US 11,773,508 B2
(45) Date of Patent: Oct. 3, 2023

(54) SUBSTRATE AND LIGHT-EMITTING ELEMENT

(71) Applicant: TDK Corporation, Tokyo (JP)

(72) Inventors: Atsushi Ohido, Tokyo (JP); Kazuhito Yamasawa, Tokyo (JP); Katsumi Kawasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 870 days.

(21) Appl. No.: 16/644,719

(22) PCT Filed: Aug. 21, 2018

(86) PCT No.: PCT/JP2018/030857
§ 371 (c)(1),
(2) Date: Mar. 5, 2020

(87) PCT Pub. No.: WO2019/049653
PCT Pub. Date: Mar. 14, 2019

(65) Prior Publication Data
US 2020/0283928 A1    Sep. 10, 2020

(30) Foreign Application Priority Data

Sep. 11, 2017   (JP) ................................ 2017-174046

(51) Int. Cl.
*C30B 29/68*    (2006.01)
*C30B 29/20*    (2006.01)
(Continued)

(52) U.S. Cl.
CPC .............. *C30B 29/68* (2013.01); *C30B 29/20* (2013.01); *C30B 29/403* (2013.01);
(Continued)

(58) Field of Classification Search
None
See application file for complete search history.

(56) References Cited

U.S. PATENT DOCUMENTS 7,338,555 B2 *  3/2008  Fukuyama ................ C23C 8/28
                                                          117/952
2005/0059257 A1  3/2005  Fukuyama et al.
(Continued)

FOREIGN PATENT DOCUMENTS

JP      2005-104829 A     4/2005
WO  WO-2005/015618 A1   2/2005
(Continued)

OTHER PUBLICATIONS

International Preliminary Report on Patentability dated Mar. 26, 2020 for PCT/JP2018/030857.

*Primary Examiner* — Daniel J. Schleis
(74) *Attorney, Agent, or Firm* — Faegre Drinker Biddle & Reath LLP

(57) ABSTRACT

A substrate 10 comprises: a first layer L1 containing crystalline aluminum nitride; a second layer L2 containing crystalline α-alumina; and an intermediate layer Lm sandwiched between the first layer L1 and the second layer L2 and containing aluminum, nitrogen, and oxygen, and the content of nitrogen in the intermediate layer Lm decreases in a direction Z from the first layer L1 toward the second layer L2, and the content of oxygen in the intermediate layer Lm increases in the direction Z from the first layer L1 toward the second layer L2.

8 Claims, 4 Drawing Sheets

(51) Int. Cl.
| | |
|---|---|
| *C30B 29/40* | (2006.01) |
| *H01L 33/00* | (2010.01) |
| *H01L 33/12* | (2010.01) |
| *H01L 33/32* | (2010.01) |
| *C01F 7/02* | (2022.01) |

(52) U.S. Cl.
CPC ............ *H01L 33/007* (2013.01); *H01L 33/12* (2013.01); *H01L 33/32* (2013.01); *C01F 7/02* (2013.01); *Y10T 428/12764* (2015.01)

(56) References Cited

U.S. PATENT DOCUMENTS

| | | |
|---|---|---|
| 2006/0051554 A1 | 3/2006 | Kumakura et al. |
| 2014/0209857 A1 | 7/2014 | Takano et al. |
| 2017/0211204 A1* | 7/2017 | Yamasawa ........ H01L 21/02491 |

FOREIGN PATENT DOCUMENTS

| | | |
|---|---|---|
| WO | WO-2013/005789 A1 | 1/2013 |
| WO | WO-2016/024514 A1 | 2/2016 |

* cited by examiner

SUBSTRATE AND LIGHT-EMITTING ELEMENT

TECHNICAL FIELD

The present invention relates to a substrate and a light-emitting element.

BACKGROUND ART

The crystals of a nitride semiconductors such as aluminum nitride (AlN) have attracted attention as a material for light-emitting devices that emit short wavelength light ranging from the blue band to the ultraviolet band, or power transistors. For example, as described in Patent Literature 1 below, an ultraviolet light-emitting diode comprises a buffer layer consisting of aluminum nitride. The buffer layer is interposed between a nitride semiconductor layer such as GaN and a single crystal substrate of sapphire, and thereby lattice mismatch between the nitride semiconductor and sapphire and threading dislocations resulting therefrom are reduced and the crystallinity of the nitride semiconductor layer such as a light-emitting layer is improved. As a result, the light emission efficiency of the light-emitting layer is also improved.

CITATION LIST

Patent Literature

Patent Literature 1: International Publication No. WO 2013/005789

SUMMARY OF INVENTION

Technical Problem

As described above, in the case of an ultraviolet light-emitting diode comprising a sapphire crystal substrate and an aluminum nitride buffer layer, light emitted from a light-emitting layer is radiated in all directions through the buffer layer and the crystal substrate. However, the refractive index of aluminum nitride constituting the buffer layer is significantly different from the refractive index of sapphire constituting the crystal substrate. Due to this difference in refractive index, part of the light emitted from the light-emitting layer located on the buffer layer is reflected at the interface (boundary) between the buffer layer and the crystal substrate. Since the reflected light does not pass through the crystal substrate, it is not extracted outside the light-emitting diode. That is, the light extraction efficiency decreases due to the reflection of light at the interface between the buffer layer and the crystal substrate.

The present invention has been made in view of the above circumstances, and an object thereof is to provide a substrate that is unlikely to reflect light, and a light-emitting element comprising the substrate.

Solution to Problem

The substrate according to one aspect of the present invention comprises: a first layer containing crystalline aluminum nitride; a second layer containing crystalline α-alumina; and an intermediate layer sandwiched between the first layer and the second layer and containing aluminum, nitrogen, and oxygen, and the content of nitrogen in the intermediate layer decreases in the direction from the first layer toward the second layer and the content of oxygen in the intermediate layer increases in the direction from the first layer toward the second layer.

The thickness of the intermediate layer may be 10 nm or more and 1000 nm or less.

The number of nitrogen atoms present in any one plane that is located within the substrate and substantially parallel to the first layer and the second layer is denoted as [N]; the number of oxygen atoms present in the any one plane is denoted as [O]; a first plane is defined as a plane where [N]/([O]+[N]) is 0.9; a second plane is defined as a plane where [N]/([O]+[N]) is 0.1; and the intermediate layer may be a region between the first plane and the second plane.

The intermediate layer may contain at least one selected from the group consisting of rare earth elements, alkaline earth elements, and alkali metal elements. The intermediate layer may contain at least one of europium and calcium.

The light-emitting element according to one aspect of the present invention comprises the above substrate.

Advantageous Effects of Invention

The present invention provides a substrate that is unlikely to reflect light, and a light-emitting element comprising the substrate.

DESCRIPTION OF EMBODIMENTS

Figure 1:
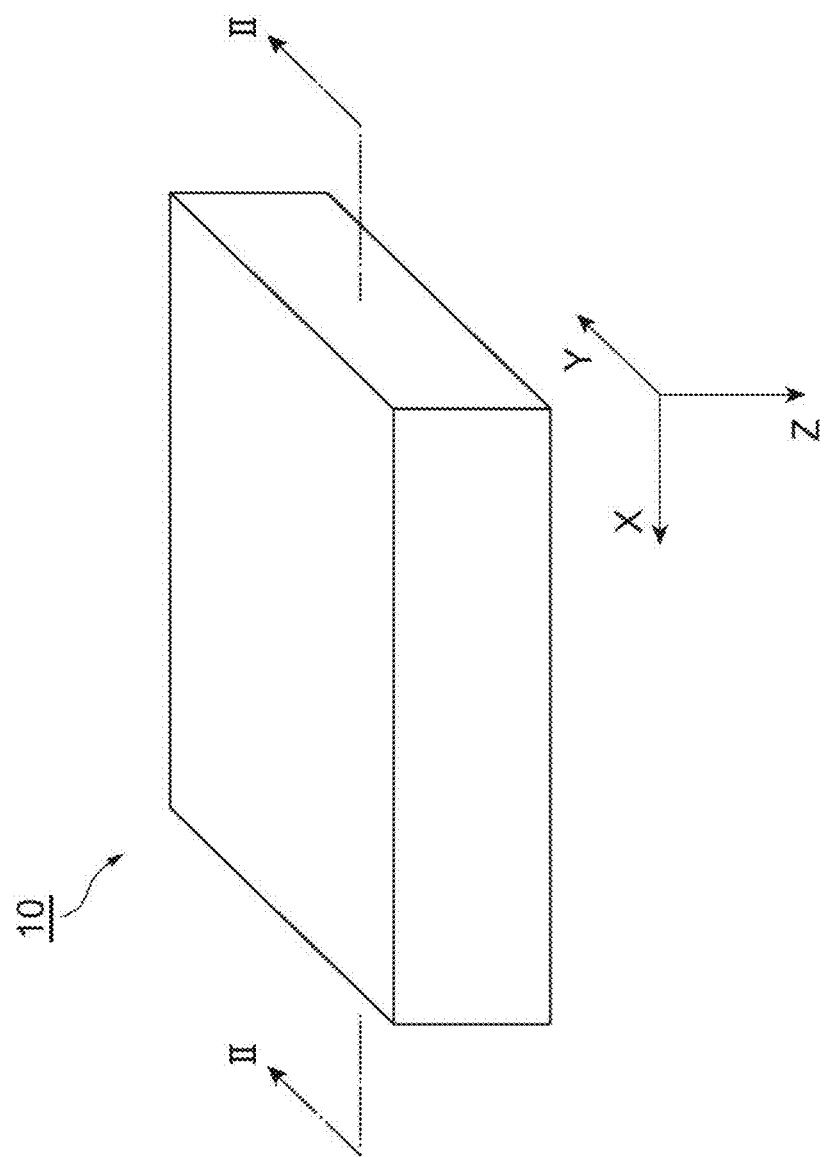
FIG. 1 is a schematic perspective view of a substrate according to one embodiment of the present invention.

Hereinafter, suitable embodiments of the present invention will be described with reference to the drawings. In the drawings, the same components are denoted by the same reference numerals. The present invention is not limited to the following embodiment. X, Y, and Z shown in each figure mean three coordinate axes orthogonal to each other. The direction indicated by each coordinate axis is common to all drawings.

(Substrate)

Figure 2:
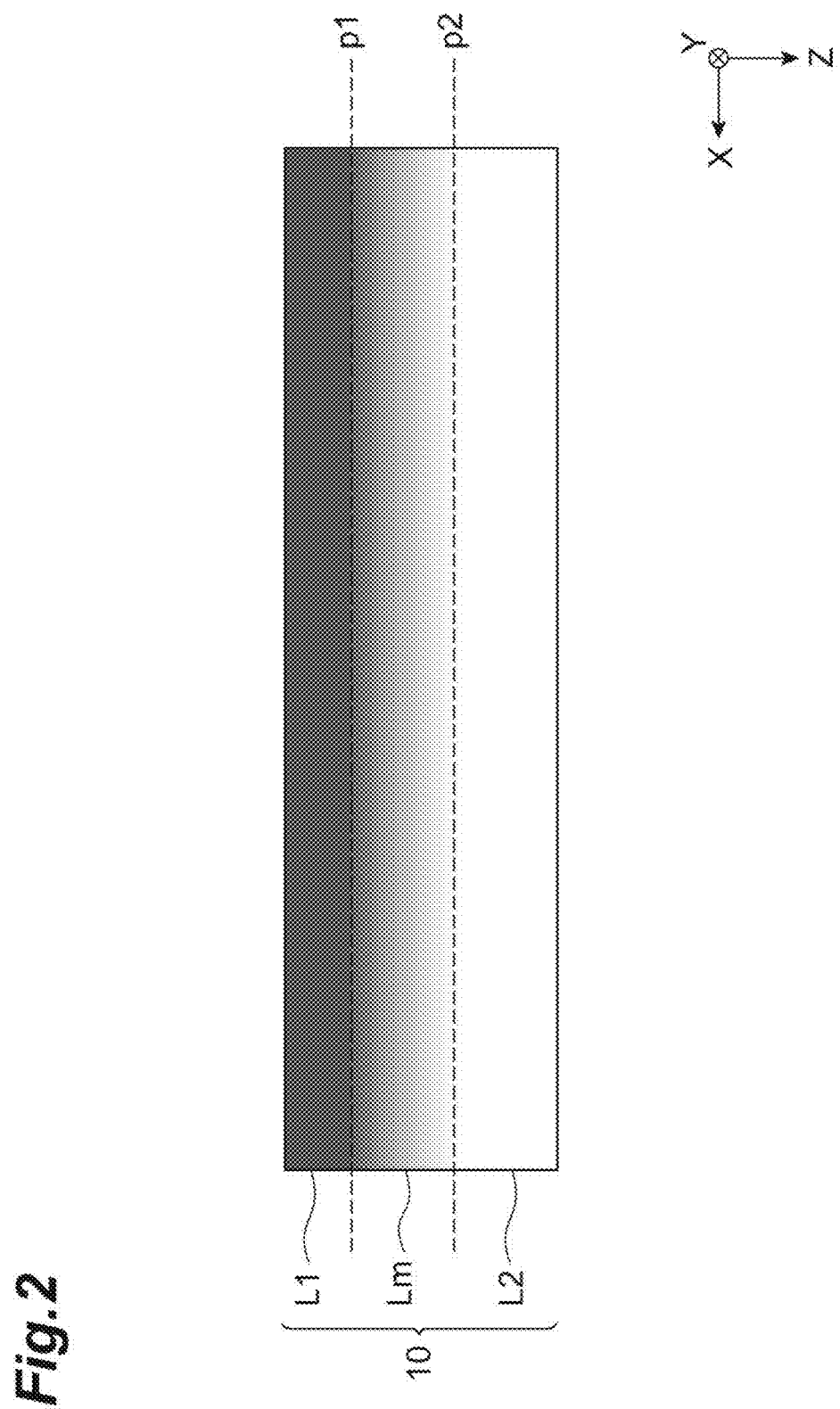
FIG. 2 is a schematic cross-sectional view of the substrate shown in FIG. 1.

The substrate according to the present embodiment is shown in FIG. 1 and FIG. 2. FIG. 2 is a cross section in the ZX plane direction of a substrate 10 shown in FIG. 1. In other words, FIG. 2 is a cross section of the substrate 10 parallel to the thickness direction Z of the substrate 10, and is a cross section of the substrate 10 perpendicular to the surface (XY plane direction) of the substrate 10. The thickness direction Z of the substrate 10 may be also referred to as a depth direction from the surface of the substrate 10.

As shown in FIG. 2, the substrate 10 comprises a first layer L1, a second layer L2, and an intermediate layer Lm sandwiched between the first layer L1 and the second layer L2. The first layer L1 is in direct contact with the intermediate layer Lm. The second layer L2 is also in direct contact with the intermediate layer Lm.

The first layer L1 contains crystalline aluminum nitride (AlN). The first layer L1 may consist of only crystalline aluminum nitride. The first layer L1 may consist of only a single crystal of aluminum nitride. However, the first layer L1 may contain elements (for example, impurities) other than aluminum and nitrogen as long as the crystallinity of aluminum nitride is not impaired. For example, the vicinity of the region facing the intermediate layer Lm in the first layer L1 may contain a trace amount of oxygen to the extent that impair the crystallinity of aluminum nitride is not impaired.

The second layer L2 contains crystalline α-alumina (α-Al$_2$O$_3$). α-Alumina may be also referred to as aluminum oxide having a corundum structure. The second layer L2 may consist of only crystalline α-alumina. The second layer L2 may consist of only sapphire. Sapphire may be also referred to as a single crystal of α-alumina. The second layer L2 may contain elements (for example, impurities) other than aluminum and oxygen as long as the crystallinity of α-alumina is not impaired. For example, the vicinity of the region facing the intermediate layer Lm in the second layer L2 may contain a trace amount of nitrogen to the extent that the crystallinity of α-alumina is not impaired.

The intermediate layer Lm contains aluminum (Al), nitrogen (N), and oxygen (O). The intermediate layer Lm may consist of aluminum, nitrogen, and oxygen.

Figure 4:
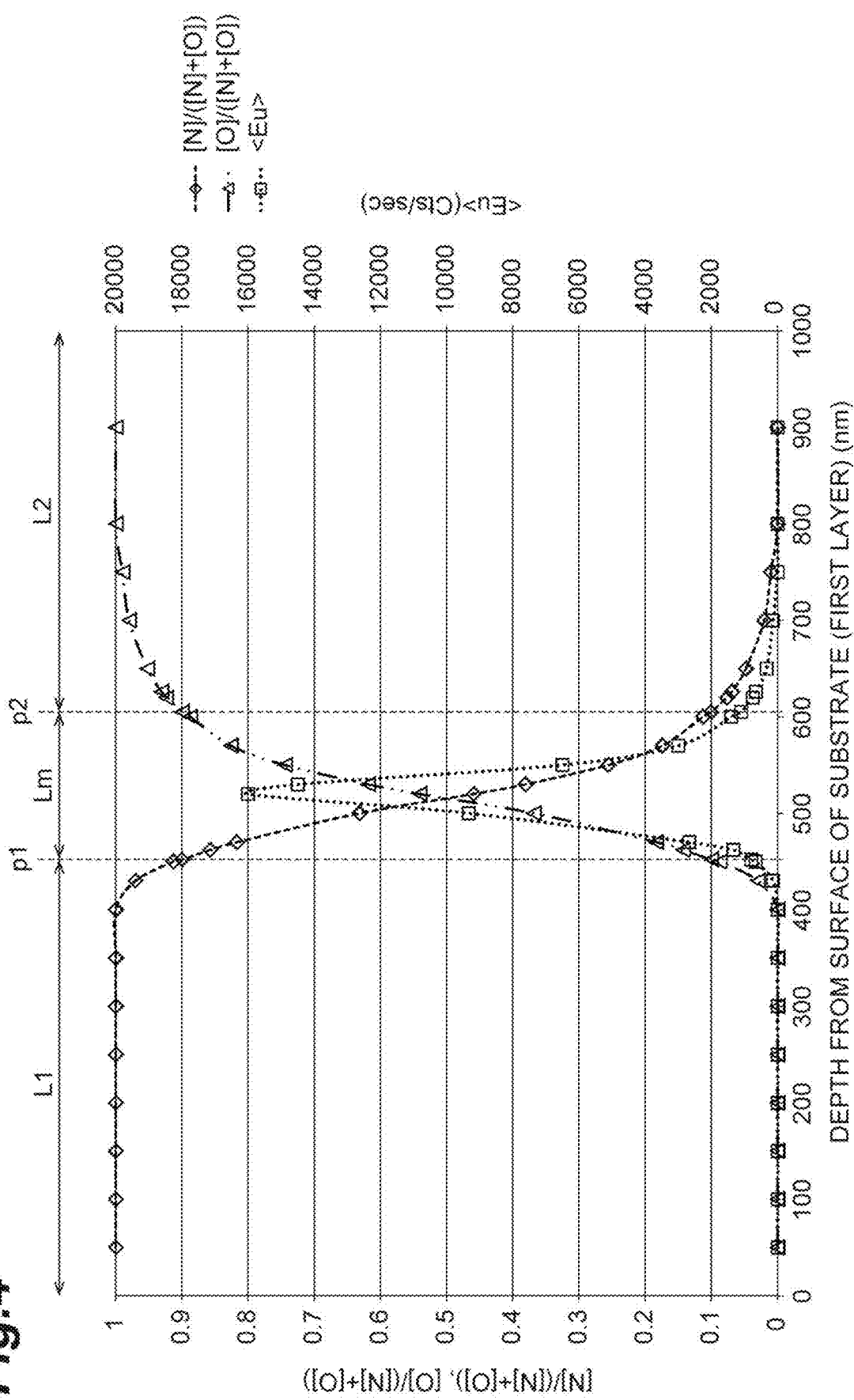
FIG. 4 shows the distribution of each of nitrogen, oxygen, and europium on the substrate in Example 1 of the present invention.

As shown in FIG. 4, the content of nitrogen in the intermediate layer Lm decreases in the direction from the first layer L1 toward the second layer L2 (thickness direction Z of the substrate 10). In contrast, the content of oxygen in the intermediate layer Lm increases in the direction from the first layer L1 toward the second layer L2 (thickness direction Z of the substrate 10). Aluminum may be distributed and dispersed throughout the intermediate layer Lm.

The intermediate layer Lm may be a region between a first plane p1 and a second plane p2. Neither the first plane p1 nor the second plane p2 is an interface (boundary) between layers, and they are defined based on the chemical composition as follows. The number of nitrogen atoms present in any one plane that is located within the substrate 10 and substantially parallel to the first layer L1 and the second layer L2 is denoted as [N], and the number of oxygen atoms present in the same plane is denoted as [O]. Based on these notations, the first plane p1 is defined as a plane where [N]/([O]+[N]) is 0.9, and the second plane p2 is defined as a plane where [N]/([O]+[N]) is 0.1. The first plane p1 may be also referred to as a plane delimiting the first layer L1 and the intermediate layer Lm based on [N]/([O]+[N]). The second plane p2 may be also referred to as a plane delimiting the second layer L2 and the intermediate layer Lm based on [N]/([O]+[N]). The unit of each of [N] and [O] may be, for example, mole.

As shown in FIG. 4, the nitrogen distribution [N]/([O]+[N]) in the intermediate layer Lm has the gradient in the direction from the first layer L1 toward the second layer L2 (thickness direction Z of the substrate 10), and gradually decreases in the direction from the first layer L1 toward the second layer L2. The oxygen distribution [O]/([O]+[N]) in the intermediate layer Lm has the gradient in the direction from the first layer L1 toward the second layer L2 (thickness direction Z of the substrate 10), and gradually increases in the direction from the first layer L1 toward the second layer L2. In the cross section of the intermediate layer Lm shown in FIG. 2 and FIG. 3, [N]/([O]+[N]) is larger in a darker portion. In other words, in the cross section of the intermediate layer Lm shown in FIG. 2 and FIG. 3, [O]/([O]+[N]) is smaller in a darker portion.

As shown in FIG. 4, the composition of the intermediate layer Lm gradually approaches the composition of the second layer L2 (that is, α-alumina) in the direction from the first layer L1 toward the second layer L2. In other words, the composition of the intermediate layer Lm gradually approaches the composition of the first layer L1 (that is, aluminum nitride) in the direction from the second layer L2 toward the first layer L1. Thus, the intermediate layer Lm is a layer in which α-alumina and aluminum nitride are mixed.

If there is no intermediate layer Lm and the first layer L1 is in direct contact with the second layer L2, light is easily reflected at the interface between the first layer L1 and the second layer L2 due to the difference in refractive index between the first layer L1 and the second layer L2. On the other hand, in the present embodiment, the intermediate layer Lm is interposed between the first layer L1 and the second layer L2, and thereby the reflection of light due to the difference in refractive index between the first layer L1 and the second layer L2 is reduced. The reason is as follows.

As described above, the composition of the substrate 10 changes gradually (slowly) and continuously in the intermediate layer Lm. In other words, in the points where the distribution of each of nitrogen and oxygen continuously changes over the first layer L1, the intermediate layer Lm, and the second layer L2, the composition of the first layer L1 is continuous with the composition of the intermediate layer Lm and the composition of the intermediate layer Lm is continuous with the composition of the second layer L2. Therefore, there is no interface (crystal structure boundary) between the first layer L1 and the intermediate layer Lm, and there is no interface between the intermediate layer Lm and the second layer L2. For example, in the cross section of the substrate 10 cut in parallel with the thickness direction Z of the substrate 10, no interfaces corresponding to the first plane p1 and the second plane p2 are observed. Since the composition of the substrate 10 changes gradually (slowly) and continuously in the intermediate layer Lm, the refractive index inside the substrate 10 also changes gradually (slowly) and continuously in the intermediate layer Lm. In other words, neither of the chemical composition and the refractive index is likely to change critically (abruptly) inside the substrate 10. Therefore, reflection of light at the interface between layers having different compositions is unlikely to occur inside the substrate 10. In other words, light reflection due to the difference in refractive index between layers is unlikely to occur inside the substrate 10.

If a third layer containing aluminum oxynitride (AlON) as a main component instead of the intermediate layer Lm is interposed between the first layer L1 and the second layer L2, it is difficult to suppress light reflection in the substrate 10, as described below. The third layer is a layer in which aluminum oxynitride as a main component is uniformly distributed or a layer consisting of crystalline aluminum oxynitride.

The aluminum oxynitride contained in the third layer is a completely different compound from the aluminum nitride (AlN) contained in the first layer L1, and hence there is an interface (crystal structure boundary) between the first layer L1 and the third layer and light is easily reflected at this interface. In other words, since the refractive index of the third layer is completely different from the refractive index of the first layer L1, light is easily reflected at the interface between the first layer L1 and the third layer due to the difference in refractive index between the first layer L1 and the third layer.

Since aluminum oxynitride contained in the third layer is a completely different compound from α-alumina contained in the second layer L2, there is an interface (crystal structure boundary) between the third layer and the second layer L2 and light is easily reflected at this interface. In other words, since the refractive index of the third layer is completely different from the refractive index of the second layer L2, light is easily reflected at the interface between the third layer and the second layer L2 due to the difference in refractive index between the third layer and the second layer L2.

According to the substrate 10 comprising the intermediate layer Lm whose composition changes continuously instead of the third layer containing aluminum oxynitride as described above, the reflection of light due to aluminum oxynitride can be reduced. The intermediate layer Lm may contain no aluminum oxynitride. The intermediate layer Lm may contain a trace amount of aluminum oxynitride to the extent that the above effect according to the present invention is not impaired.

As shown in FIG. 4, [N]/([O]+[N]) in the vicinity of the region belonging to the first layer L1 and facing the intermediate layer Lm may be more than 0.9 and 1.0 or less. In other words, [O]/([O]+[N]) in the vicinity of the region belonging to the first layer L1 and facing the intermediate layer Lm may be 0 or more and less than 0.1. As shown in FIG. 4, [N]/([O]+[N]) in the vicinity of the region belonging to the second layer L2 and facing the intermediate layer Lm may be 0 or more and less than 1.0. In other words, [O]/([O]+[N]) in the vicinity of the region belonging to the second layer L2 and facing the intermediate layer Lm may be more than 0.9 and 1.0 or less.

The thickness of the intermediate layer Lm may be, for example, 10 nm or more and 1000 nm or less, or 25 nm or more and 1000 nm or less. When the thickness of the intermediate layer Lm is 10 nm or more, the reflectance of light on the substrate 10 is easily reduced, and particularly, the reflectance of light whose wavelength is 200 nm or more is easily reduced. The light of 200 nm or more may be, for example, DUV (deep ultraviolet) whose wavelength is about 200 nm, UV-C whose wavelength is about 200 nm or more and 280 nm or less, UV-B whose wavelength is about 280 nm or more and 315 nm or less, or UV-A whose wavelength is about 315 nm or more and 380 nm or less. However, even in the case of light outside these wavelength regions, light reflection in the substrate 10 can be suppressed. When the thickness of the intermediate layer Lm is 1000 nm or less, cracking in the first layer L1 containing crystalline aluminum nitride is easily suppressed, and a smooth surface of the first layer L1 is easily formed. As a result, structural defects in other layers (for example, nitride semiconductor layers) formed on the surface of the first layer L1 are easily suppressed. That is, cracking in the first layer L1 is suppressed and the surface of the first layer L1 is smooth, and thereby the substrate 10 is easily used as a member constituting a device such as a light-emitting element. The thickness of the intermediate layer Lm may be 10 nm or more and 750 nm or less, or 25 nm or more and 750 nm or less. When the thickness of the intermediate layer Lm is 750 nm or less, cracking in the first layer L1 containing crystalline aluminum nitride is more easily suppressed, and a smooth surface of the first layer L1 is more easily formed. Even when the thickness of the intermediate layer Lm is outside the above range, the effects of the present invention may be achieved.

The thickness of the substrate 10 may be, for example, 50 µm or more and 3000 µm or less. The thickness of the first layer L1 may be, for example, 50 nm or more and 1000 nm or less. The thickness of the second layer L2 may be, for example, 50 µm or more and 3000 µm or less.

The intermediate layer Lm may contain at least one additive element M selected from the group consisting of rare earth elements, alkaline earth elements, and alkali metal elements. That is, the intermediate layer Lm may contain at least one additive element M selected from the group consisting of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), calcium (Ca), strontium (Sr), barium (Ba), lithium (Li), sodium (Na), potassium (K), rubidium (Rb), cesium (Cs), and radium (Ra). The intermediate layer Lm may contain a plurality of additive elements M. The intermediate layer Lm contains the additive element M, and thereby the distribution of each of nitrogen and oxygen in the intermediate layer Lm easily changes gradually and aluminum oxynitride is unlikely to exist in the intermediate layer Lm. Such an effect due to the additive element M is significant when the intermediate layer Lm contains at least one of Eu and Ca as the additive element M, and is particularly significant when the intermediate layer Lm contains Eu. In addition, the additive element M (for example, Eu) whose ionic radius is larger than that of aluminum, oxygen, and nitrogen is located in the intermediate layer Lm between the first layer L1 and the second layer L2, and thereby the stress is easily concentrated on the additive element M and the warping of the first layer L1 is easily eliminated. The content of the additive element M in the intermediate layer Lm may be, for example, more than 0 atomic % and 1.0 atomic % or less. When the content of the additive element M in the intermediate layer Lm is within the above range, the above effect due to the additive element M is easily obtained. The intermediate layer Lm may consist of aluminum, nitrogen, oxygen, and the additive element M.

(Manufacturing Method of Substrate)

The substrate 10 is manufactured by the nitriding treatment in which a substrate consisting of α-alumina single crystal is heated in nitrogen gas to thermally diffuse nitrogen from one surface of the substrate to the inside of the substrate. Hereinafter, the substrate consisting of α-alumina single crystal is denoted as a "sapphire substrate."

Nitrogen is more difficult to diffuse and arrive at the position where the depth from the surface of the sapphire substrate increases, and hence the content of nitrogen gradually decreases in the depth direction from the surface of the sapphire substrate. As a result, the intermediate layer Lm is formed in a region where the depth from the surface of the sapphire substrate is a predetermined value or more. The region at which nitrogen has not diffuse and has not arrived remains as the second layer containing crystalline α-alumina. On the other hand, the vicinity of the surface of the sapphire substrate into which nitrogen has been introduced is sufficiently nitrided to become the first layer L1 containing crystalline aluminum nitride.

Before the sapphire substrate is heated in nitrogen gas, it is preferable that at least one additive element M selected from the group consisting of rare earth elements, alkaline earth elements, and alkali metal elements is attached to part of or the entire surface of the sapphire substrate. For example, a solution of an organometallic compound containing the additive element M may be applied to the surface of the sapphire substrate. Furthermore, the sapphire substrate coated with the solution may be heated in the air atmosphere to decompose and burn off only the organic component. As a solution of the organometallic compound comprising the additive element M, for example, a solution of an organometallic compound used in the metal organic decomposition (MOD) method may be used.

It is preferable to heat the sapphire substrate to which the additive element M is attached in nitrogen gas. As a result, the additive element M draws oxygen ($O^{2-}$) from the surface of the sapphire substrate, and oxygen defects are formed on the surface of the sapphire substrate. Nitrogen is easily introduced into oxygen defects, and easily thermally diffuses from the surface of the sapphire substrate through the oxygen defects into the sapphire substrate. As a result, each of the first layer L1, the intermediate layer Lm, and the second layer L2 is easily formed uniformly in the direction parallel to the surface of the substrate 10.

Of the additive elements M, at least one of europium and calcium is preferable, and europium is most preferable. Europium or calcium is an element whose electronegativity is relatively small. Therefore, europium or calcium is attached to the surface of the sapphire substrate, and thereby europium or calcium easily draws oxygen ($O^{2-}$) from the surface of the sapphire substrate and oxygen defects are easily formed on the surface of the sapphire substrate. As a result, nitrogen easily thermally diffuses into the sapphire substrate through oxygen defects, and the first layer L1, the intermediate layer Lm, and the second layer L2 are easily formed. In addition, europium or calcium is an element whose melting point is relatively low among the additive elements M. Therefore, europium or calcium easily diffuses over the entire surface of the sapphire substrate as a semi-liquid phase even at a low temperature. As a result, each of the first layer L1, the intermediate layer Lm, and the second layer L2 is easily formed uniformly in the direction parallel to the surface of the substrate 10.

When the temperature of the substrate heated in nitrogen gas reaches 1630° C. or more, aluminum oxynitride that contributes to light reflection starts to be generated in the substrate, and aluminum oxynitride is easily generated particularly at 1700° C. or more. However, when the temperature of the sapphire substrate is 1680° C. or less, the sapphire substrate to which the additive element M is attached is heated in nitrogen gas, and thereby the first layer L, the intermediate layer Lm, and the second layer L2 can be formed while the generation of aluminum oxynitride is sufficiently suppressed. Particularly, when the additive element M is attached to the sapphire substrate, the first layer L1, the intermediate layer Lm, and the second layer L2 can be formed at a temperature of 1630° C. or less at which aluminum oxynitride is not generated.

As described above, europium and calcium easily diffuse sufficiently over the entire surface of the sapphire substrate even at a relatively low temperature, and oxygen is easily drawn from the surface of the sapphire substrate. Therefore, even when the temperature of the substrate heated in the nitrogen gas is a low temperature (for example, less than 1630° C., or 1600° C. or less) at which aluminum nitride is unlikely to be generated, using at least one of europium and calcium easily causes nitrogen to thermally diffuse in the sapphire substrate, allowing for the first layer L1, the intermediate layer Lm, and the second layer L2 to be easily formed.

When the additive element M whose melting point is higher than that of europium and calcium is used, the sapphire substrate to which the additive element M is attached must be heated at a higher temperature with compared to the case where europium or calcium is used in order to diffuse the additive element M over the entire surface of the sapphire substrate. However, as the temperature of the sapphire substrate is higher, it is easier to generate aluminum oxynitride that contributes to light reflection.

The temperature (nitriding treatment temperature) of the sapphire substrate heated in nitrogen gas may be 1550° C. or more and 1700° C. or less, 1600° C. or more and 1680° C. or less, or 1600° C. or more and less than 1630° C. As described above, even when the additive element M is used, the nitriding treatment temperature is preferably at least 1550° C. or more in order to thermally diffuse the nitrogen gas into the sapphire substrate. When the additive element M is not used, the nitriding of sapphire proceeds at a nitriding treatment temperature of 1630° C. or more and aluminum oxynitride is generated in the substrate. However, even when the nitriding treatment temperature is 1630° C. or less, sapphire can be nitrided without generation of aluminum oxynitride in the substrate by using the additive element M (particularly at least one of europium and calcium). When the nitriding treatment temperature is less than 1700° C., more preferably 1630° C. or less, the generation of aluminum oxynitride in the substrate can be suppressed. When the nitriding treatment temperature is less than 1630° C. or 1600° C. or less, using the additive element M can generate aluminum nitride on the surface of the substrate. When the nitriding treatment temperature is 1600° C. or more and less than 1630° C., the smoothness of the surface of the first layer L1 containing crystalline aluminum nitride is easily improved.

The thickness and composition of each of the first layer L1 and the intermediate layer Lm may be controlled by the temperature of the nitriding treatment, the period of time of the nitriding treatment, the amount of the additive element M used, and the partial pressure or supply of nitrogen gas. As the temperature of the sapphire substrate heated in nitrogen gas is higher, the diffusion of nitrogen in the sapphire substrate and the nitriding of sapphire are promoted, and the thickness of each of the first layer L1 and the intermediate layer Lm is easily increased and the thickness of the second layer L2 is easily decreased. As the time of heating applied to the sapphire substrate in nitrogen gas is longer, the diffusion of nitrogen in the sapphire substrate and the nitriding of sapphire are promoted, and the thickness of each of the first layer L1 and the intermediate layer Lm is easily increased and the thickness of the second layer L2 is easily decreased. As there is more additive element M that adheres to the surface of the sapphire substrate and diffuses, the diffusion of nitrogen in the sapphire substrate and the nitriding of sapphire are promoted, and the thickness of each of the first layer L1 and the intermediate layer Lm is easily increased and the thickness of the second layer L2 is easily decreased. As the partial pressure or supply of nitrogen gas is larger, the diffusion of nitrogen in the sapphire substrate and the nitriding of sapphire are promoted, and the thickness of each of the first layer L1 and the intermediate layer Lm is easily increased and the thickness of the second layer L2 is easily decreased.

In the nitriding treatment, the sapphire substrate may be heated in nitrogen gas a plurality of times (for example, twice). For example, the sapphire substrate to which the additive element M is attached is heated at the above nitriding treatment temperature for a short time, and then the sapphire substrate may be heated at the above nitriding treatment temperature for a longer time. The first heating causes the additive element M to easily diffuse uniformly over the entire surface of the sapphire substrate. In other words, the first heating causes the additive element M to easily diffuse uniformly to the surface layer of the sapphire substrate. The subsequent second heating for a long time causes nitrogen to evenly diffuse from the surface of the sapphire substrate to the inside thereof. As a result, the smoothness of the surface of the first layer L1 is easily improved. When the sapphire substrate is heated for a long time without dividing the nitriding treatment into two steps, the smoothness of the surface of the first layer L1 is easily impaired. However, even when the nitriding treatment is not divided into two steps, the substrate 10 according to the present embodiment can be manufactured.

The nitriding treatment of the sapphire substrate in nitrogen gas may be performed in the presence of carbon powder. Oxygen drawn from the sapphire substrate by the additive element M reacts with carbon in the atmosphere to generate carbon monoxide.

(Light-Emitting Element)

The light-emitting element according to the present embodiment comprises the above substrate 10. For example, the light-emitting element according to the present embodiment may be a light-emitting diode. That is, the substrate 10 according to the present embodiment may be a substrate provided in a deep ultraviolet light-emitting diode such as a UVC LED or a DUV LED. Hereinafter, a light-emitting diode 100 shown in FIG. 3 will be described as an example of a light-emitting element comprising the substrate 10. However, the structure of the light-emitting diode 100 according to the present embodiment is not limited to the multilayered structure shown in FIG. 3.

Figure 3:
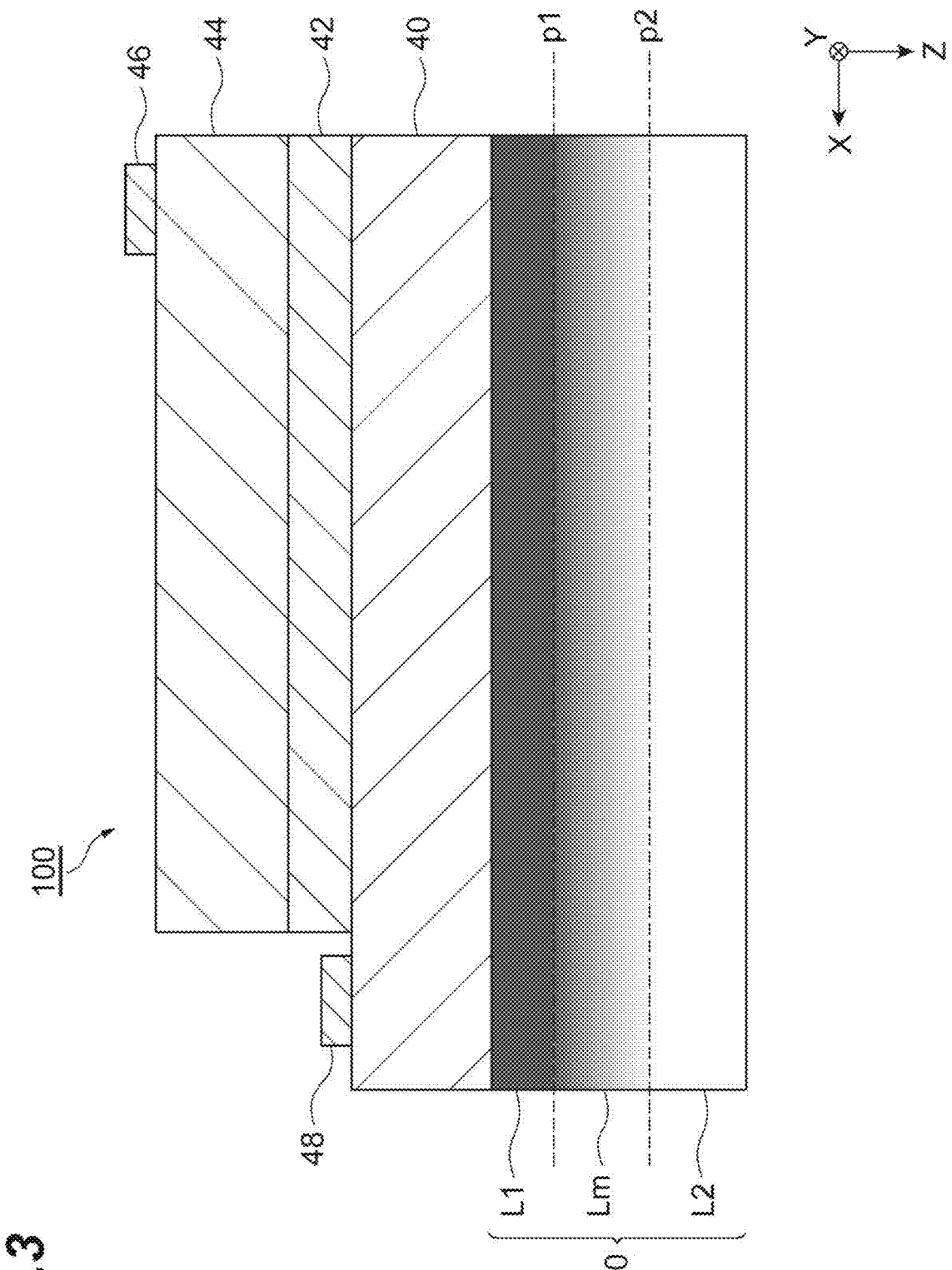
FIG. 3 is a schematic cross-sectional view of a light-emitting element having the substrate according to one embodiment of the present invention.

As shown in FIG. 3, the light-emitting diode 100 according to the present embodiment comprises: the substrate 10; an n-type semiconductor layer 40 directly overlapping the first layer L1 exposed on one side of the substrate 10; a light-emitting layer 42 overlapping the n-type semiconductor layer 40; a p-type semiconductor layer 44 overlapping the light-emitting layer 42; a first electrode 48 disposed on part of the surface of the n-type semiconductor layer 40; and a second electrode 46 disposed on part of the surface of the p-type semiconductor layer 44. Although not shown in FIG. 3, an electron blocking layer may be interposed between the light-emitting layer 42 and the p-type semiconductor layer 44.

The n-type semiconductor layer 40 may contain, for example, n-type gallium nitride (n-GaN) or n-type aluminum gallium nitride (n-AlGaN). The n-type semiconductor layer 40 may further contain silicon (Si). The n-type semiconductor layer 40 may be composed of a plurality of layers. The light-emitting layer 42 may contain, for example, gallium nitride (GaN), aluminum gallium nitride (AlGaN), or indium gallium nitride (InGaN). The light-emitting layer 42 may be composed of a plurality of layers. The p-type semiconductor layer 44 may contain, for example, p-type gallium nitride (p-GaN) or p-type aluminum gallium nitride (p-AlGaN). The p-type semiconductor layer 44 may further contain magnesium (Mg). The p-type semiconductor layer 44 may be composed of a plurality of layers. The first electrode 48 disposed on the n-type semiconductor layer 40 may contain, for example, indium (In). The second electrode 46 disposed on the p-type semiconductor layer 44 may contain, for example, at least one of nickel (Ni) and gold (Au).

Light emitted from the light-emitting layer 42 is radiated in all directions through the n-type semiconductor layer 40 and the substrate 10. As described above, the substrate 10 includes the intermediate layer Lm, and hence the light emitted from the light-emitting layer 42 is unlikely to be reflected by the substrate 10. Therefore, compared with a conventional light-emitting diode comprising a substrate consisting of only sapphire, the light emitted from the light-emitting layer 42 easily passes through the substrate 10 and the light extraction efficiency is improved.

One embodiment of the present invention has been described as above, but the present invention is not limited to the above embodiment in any way.

For example, the use of the substrate 10 according to the present embodiment is not limited to the light-emitting diode. The light-emitting element according to the present embodiment may be a semiconductor laser oscillator. That is, the substrate 10 according to the present embodiment may be a substrate provided in a semiconductor laser oscillator such as an ultraviolet laser. The substrate 10 according to the embodiment may be used for a power transistor.

EXAMPLES

Hereinafter, the present invention will be described in more detail with reference to Examples and Comparative Examples, but the present invention is not limited to these Examples in any way.

Example 1

An MOD solution containing a Eu compound (organic compound) was applied to the entire c-plane of a sapphire substrate by spin coating. The diameter $\phi$ of the sapphire substrate was 2 inches. The concentration of the Eu compound in the MOD solution was 0.02% by mass. Spin coating was performed at 2000 rpm for 20 seconds. The sapphire substrate to which the MOD solution was applied was dried on a hot plate at 150° C. for 10 minutes and then heated in air at 600° C. for 2 hours.

The heated substrate was placed on a 100 mm square alumina plate, and 5 mg of carbon powder (total of 20 mg of carbon) was placed at each of four locations around the substrate. Subsequently, the entire substrate was covered with an alumina saggar, and then the substrate was placed on a sample base in a nitriding treatment furnace. The dimensions of the alumina saggar were 75 mm long×75 mm wide×70 mm high. As the nitriding treatment furnace, a resistance heating electric furnace using carbon as a heater was used. Before the substrate was heated in the nitriding treatment furnace, the furnace was evacuated to 0.03 Pa using a rotary pump and a diffusion pump. Next, nitrogen gas was flowed into the furnace until the pressure inside the furnace reached 100 kPa (atmospheric pressure), and then the supply of nitrogen gas was stopped. Subsequently, in the first nitriding treatment, the substrate in the furnace was heated at 1600° C. for 2 hours. The temperature rising/falling rate in the furnace during the nitriding treatment was adjusted to 600° C./hour. After the nitriding treatment, the substrate was cooled to room temperature, and then the substrate was taken out of the furnace.

The substrate that had been subjected to the first nitriding treatment was placed on a 100 mm square alumina plate, and 20 mg of carbon powder (a total of 80 mg of carbon) was placed at each of four locations around the substrate. Subsequently, the entire substrate was covered with the above alumina saggar, and then the substrate was placed on the sample base in the above nitriding treatment furnace. The furnace was evacuated to 0.03 Pa using a rotary pump and a diffusion pump. Next, nitrogen gas was flowed into the furnace until the pressure inside the furnace reached 100 kPa (atmospheric pressure), and then the supply of nitrogen gas was stopped. Subsequently, in the second nitriding treatment, the substrate in the furnace was heated at 1600° C. for 8 hours. The temperature rising/falling rate in the furnace in the second nitriding treatment was adjusted to 600° C./hour.

After the second nitriding treatment, the substrate was cooled to room temperature, and then the substrate was taken out of the furnace.

The substrate in Example 1 was produced by the above procedure.

Examples 2 to 5

In the production of each substrate in Examples 2 to 5, the time of the second nitriding treatment was adjusted to the value shown in Table 1 below. Each substrate in Examples 2 to 5 was produced in the same manner as in Example 1 except for the time of the second nitriding treatment.

Comparative Example 1

A thin film of aluminum nitride was deposited on the entire c-plane of the sapphire substrate by using the direct current magnetron sputtering method. The diameter φ of the sapphire substrate was 2 inches. The thickness of the aluminum nitride thin film was 200 nm. Metal aluminum was used as the sputtering target. As the source gas, a mixed gas of nitrogen gas and argon ($N_2$ volume:Ar volume=3:1) was used. The power of sputtering was 700 W. The temperature of the sapphire substrate during the deposition was 650° C., and the deposition time was 30 minutes.

After the above sputtering, the substrate was placed on a 100 mm square alumina plate, and 5 mg of carbon powder (total of 20 mg of carbon) was placed at each of four locations around the substrate. Subsequently, the entire substrate was covered with the above alumina saggar, and then the substrate was placed on the sample base in the above nitriding treatment furnace. Before the substrate was heated in the nitriding treatment furnace, the furnace was evacuated to 0.03 Pa using a rotary pump and a diffusion pump. Next, nitrogen gas was flowed into the furnace until the pressure inside the furnace reached 100 kPa (atmospheric pressure), and then the supply of nitrogen gas was stopped. Subsequently, in the first nitriding treatment, the substrate in the furnace was heated at 1600° C. for 4 hours. The temperature rising/falling rate in the furnace during the nitriding treatment was adjusted to 600° C./hour. After the nitriding treatment, the substrate was cooled to room temperature, and then the substrate was taken out of the furnace.

The substrate in Comparative Example 1 was produced by the above procedure.

[Measurement of X-Ray Diffraction Pattern]

A 10 mm square sample was cut out from the vicinity of the center of the substrate in Example 1. The XRD pattern of the sample in Example 1 was measured by the X-ray diffraction (XRD) method using Cu as a target. The XRD pattern of the sample had a diffraction line peak derived from the (002) plane of AlN. The polar diagram of the (112) plane of AlN was measured by the XRD method. The polar diagram had 6 peaks showing symmetry with 6 rotation axes. Therefore, it was confirmed that the sample included a single crystal of hexagonal AlN. On the other hand, the XRD pattern of the sample did not have a diffraction line peak derived from the crystal phase containing Eu. The XRD pattern of the sample also did not have a peak derived from the crystal phase of aluminum oxynitride (AlON). The above result confirmed that an AlN single crystal layer oriented along the c-axis of the sapphire substrate was formed on one surface of the sapphire substrate. The "one surface of the sapphire substrate" is the surface of the substrate that has been exposed to the nitrogen gas without being in contact with the alumina plate in the nitriding treatment, and means a nitrided surface. The "surface of the sample" described below is also the surface of the substrate exposed in nitrogen gas without being in contact with the alumina plate in the nitriding treatment, and means a nitrided surface.

In the same manner as in Example 1, each of the substrates in Examples 2 to 5 and Comparative Example 1 was individually analyzed by the XRD method.

In any case of the substrates in Examples 2 to 5 and Comparative Example 1, it was confirmed that an AlN single crystal layer oriented along the c-axis of the sapphire substrate was formed on one surface of the sapphire substrate. None of the XRD patterns in Examples 2 to 5 and Comparative Example 1 had a diffraction line peak derived from a crystal phase containing Eu. In addition, none of the XRD patterns in Examples 2 to 5 and Comparative Example 1 had a peak derived from the crystal phase of aluminum oxynitride (AlON).

[Observation of Surface]

The surface of the sample in Example 1 was observed with a metallurgical microscope. The entire surface of the sample was smooth. In the same manner as in Example 1, each of the substrates in Examples 2 to 5 and Comparative Example 1 was observed with a metallurgical microscope. All of the surfaces of the samples in Examples 2 to 4 and Comparative Example 1 were smooth as in the case of Example 1. The surface of the sample in Example 5 was also smooth, but several cracks were formed on the surface in Example 5. In the case of Example 5 in which the time of the second nitriding treatment was the longest, it is assumed that cracks were formed since the intermediate layer described below became thicker and the stress due to the difference in thermal expansion coefficient between the first layer (aluminum nitride) and the second layer (α-alumina) increased. If the intermediate layer is thicker than the intermediate layer in Example 5, it is predicted that a larger number of cracks will be formed and the substrate will be difficult to use as a member of a light-emitting element or the like.

The surface of the sample in Example 1 was analyzed with an atomic force microscope (AFM). The root mean square roughness (RMS) of the surface of the sample in Example 1 was 0.2 nm. In the same manner as in Example 1, each of the surfaces of the samples in Examples 2 to 5 and Comparative Example 1 was analyzed with AFM. The root mean square roughness (RMS) of each of the surfaces of the samples in Examples 2 to 5 and Comparative Example 1 was also 0.2 nm. Based on the analysis using AFM, all of the surfaces of the samples in Examples 1 to 5 and Comparative Example 1 were smooth.

[Measurement of Light Reflectance]

The light reflectance of the sample in Example 1 was measured with a spectrophotometer. In the measurement of reflectance, ultraviolet rays whose wavelength was 250 nm were incident on the surface of the sample in Example 1. Any of the "ultraviolet rays" described below means ultraviolet rays whose wavelengths are 250 nm. The measured value of the reflectance in Example 1 is a relative reflectance when a mirror whose ultraviolet reflectance is 98% is adopted as the reference plate.

The relative reflectance (relative reflectance 1) at the interface between aluminum nitride and air was calculated from the refractive index (2.406) of aluminum nitride with respect to ultraviolet rays. The relative reflectance (relative reflectance 2) at the interface between sapphire and air was calculated from the refractive index (1.83) of sapphire with respect to ultraviolet rays.

The light reflectance inside the substrate in Example 1 was calculated by subtracting the relative reflectances 1 and 2 from the measured value of reflectance in Example 1. Hereinafter, the light reflectance inside the substrate is denoted as "internal reflectance." The internal reflectance in Example 1 is shown in Table 1 below.

In the same manner as in Example 1, each of the internal reflectances in Examples 2 to 5 and Comparative Example 1 was calculated. Each of the internal reflectances in Examples 2 to 5 and Comparative Example 1 is shown in Table 1 below.

[Analysis of Composition and Structure Inside Substrate]

The sample in Example 1 was broken and the fracture surface of the sample was observed with a scanning electron microscope (SEM) and a transmission electron microscope (TEM). No interface (clear boundary) between the single crystal layer of aluminum nitride (first layer) and the non-nitrided sapphire layer (second layer) was found in the fracture surface.

In the same manner as in Example 1, each of the substrates in Examples 2 to 5 and Comparative Example 1 was observed with SEM and TEM. In all cases of Examples 2 to 5, no interface (clear boundary) between the single crystal layer of aluminum nitride (first layer) and the non-nitrided sapphire layer (second layer) was found in the fracture surface. On the other hand, in Comparative Example 1, it was confirmed that there was an interface (clear boundary) between the single crystal layer of aluminum nitride (first layer) and the non-nitrided sapphire layer (second layer). The high internal reflectance in Comparative Example 1 is assumed to be due to the interface between the single crystal layer of aluminum nitride (first layer) and the sapphire layer (second layer).

The composition of the sample was analyzed in the depth direction from the surface of the sample while the surface of the sample in Example 1 was gradually dug by sputtering. The depth direction means the Z-axis direction (direction perpendicular to the surface of the substrate 10) shown in FIG. 1 and FIG. 2. The analysis in the depth direction means an analysis of the composition of the cross section of the dug sample (the cross section of the sample perpendicular to the depth direction). For analysis of the composition, ESCA (Electron Spectroscopy for Chemical Analysis) and SIMS (Secondary Ion Mass Spectrometry) were used. Each content of aluminum, nitrogen, and oxygen in the sample was measured by ESCA. The content of europium in the sample was measured by SIMS. Each profile of [N]/([O]+[N]) and [O]/([O]+[N]) in the depth direction is shown in Table 2 and FIG. 4. The amount of europium <Eu> detected in the depth direction is also shown in Table 2 and FIG. 4. The unit of the amount of europium <Eu> detected (Cts/sec) is the number of Eu atoms (secondary ions) detected per second.

As a result of the analysis, it was confirmed that the substrate in Example 1 comprised the first layer consisting of the single crystal of aluminum nitride, the second layer consisting of crystalline α-alumina, and the intermediate layer sandwiched between the first layer and the second layer. It was confirmed that the intermediate layer consisted of aluminum, nitrogen, oxygen, and europium. In the analysis in the depth direction, the first layer was detected and then the intermediate layer was detected, and after the intermediate layer was detected, the second layer was detected. As shown in FIG. 4, it was confirmed that [N]/([O]+[N]) in the intermediate layer Lm decreased in the direction (depth direction) from the first layer L1 toward the second layer L2. In addition, it was confirmed that [O]/([O]+[N]) in the intermediate layer Lm increased in the direction (depth direction) from the first layer L1 toward the second layer L2. When D1 is the depth where [N]/([O]+[N]) is 0.9 and D2 is the depth where [N]/([O]+[N]) is 0.1, the thickness of the intermediate layer Lm is represented as D2−D1. As shown in FIG. 2 and FIG. 4, the thickness of the intermediate layer Lm is also referred to as the distance between the first plane p1 and the second plane p2. The thickness of the intermediate layer in Example 1 is shown in Table 1 below.

In the same manner as in Example 1, each of the substrates in Examples 2 to 5 and Comparative Example 1 was analyzed by using ESCA and SIMS.

As a result of the analysis, it was confirmed as in Example 1 that each of the substrates in Examples 2 to 5 comprised the first layer consisting of the single crystal of aluminum nitride, the second layer consisting of crystalline α-alumina, and the intermediate layer sandwiched between the first layer and the second layer. It was confirmed as in Example 1 that each of the intermediate layers in Examples 2 to 5 consisted of aluminum, nitrogen, oxygen, and europium. In all cases of Examples 2 to 5, in the analysis in the depth direction, the first layer was detected and then the intermediate layer was detected, and after the intermediate layer was detected, the second layer was detected, as in Example 1. In all cases of Examples 2 to 5, it was confirmed as in Example 1 that [N]/([O]+[N]) in the intermediate layer Lm decreased in the direction (depth direction) from the first layer L1 toward the second layer L2. In addition, in all cases of Examples 2 to 5, it was confirmed as in Example 1 that [O]/([O]+[N]) in the intermediate layer Lm increased in the direction (depth direction) from the first layer L1 toward the second layer L2. Each of thicknesses of the intermediate layer in Examples 2 to 5 is shown in Table 1 below.

On the other hand, it was confirmed that the substrate in Comparative Example 1 comprised the first layer consisting of the single crystal of aluminum nitride and the second layer consisting of crystalline α-alumina, and there was no other layer between the first layer and the second layer. That is, the first layer directly overlapped the second layer.

TABLE 1

| | Time of second nitriding treatment | Thickness of intermediate layer (nm) | Internal reflectance (%) | Surface texture |
|---|---|---|---|---|
| Example 1 | 8 | 100 | 0.1 | Smooth |
| Example 2 | 40 | 500 | 0.2 | Smooth |
| Example 3 | 2 | 10 | 0.1 | Smooth |
| Example 4 | 60 | 750 | 0.2 | Smooth |
| Example 5 | 80 | 1000 | 0.2 | Smooth and cracking |
| Comparative Example 1 | — | 0 | 1.9 | Smooth |

TABLE 2

| Depth (nm) | [N]/([N] + [O]) | [O]/([N] + [O]) | <Eu> (Cts/sec) |
|---|---|---|---|
| 50 | 1.0 | 0.0 | 0 |
| 100 | 1.0 | 0.0 | 0 |
| 150 | 1.0 | 0.0 | 0 |
| 200 | 1.0 | 0.0 | 0 |
| 250 | 1.0 | 0.0 | 0 |
| 300 | 1.0 | 0.0 | 0 |
| 350 | 1.0 | 0.0 | 0 |
| 400 | 1.0 | 0.0 | 0 |
| 430 | 1.0 | 0.0 | 133 |
| 450 | 0.9 | 0.1 | 667 |
| 452 | 0.9 | 0.1 | 800 |

TABLE 2-continued

| Depth (nm) | [N]/([N] + [O]) | [O]/([N] + [O]) | <Eu> (Cts/sec) |
|---|---|---|---|
| 462 | 0.9 | 0.1 | 1333 |
| 470 | 0.8 | 0.2 | 2667 |
| 500 | 0.6 | 0.4 | 9333 |
| 520 | 0.5 | 0.5 | 16000 |
| 530 | 0.4 | 0.6 | 14500 |
| 550 | 0.3 | 0.7 | 6500 |
| 570 | 0.2 | 0.8 | 3000 |
| 600 | 0.1 | 0.9 | 1400 |
| 605 | 0.1 | 0.9 | 1100 |
| 620 | 0.1 | 0.9 | 750 |
| 626 | 0.1 | 0.9 | 650 |
| 650 | 0.0 | 1.0 | 330 |
| 700 | 0.0 | 1.0 | 133 |
| 750 | 0.0 | 1.0 | 0 |
| 800 | 0.0 | 1.0 | 0 |
| 900 | 0.0 | 1.0 | 0 |

INDUSTRIAL APPLICABILITY

The substrate according to the present invention is used for a substrate of an ultraviolet light-emitting diode, for example.

REFERENCE SIGNS LIST

10: Substrate, 40: n-Type semiconductor layer, 42: Light-emitting layer, 44: p-Type semiconductor layer, 46: Second electrode, 48: First electrode, 100: Light-emitting diode, L1: First layer, L2: Second layer, Lm: Intermediate layer, p1: First plane, p2: Second plane.

The invention claimed is:

1. A substrate comprising:
a first layer containing crystalline aluminum nitride;
a second layer containing crystalline α-alumina; and
an intermediate layer sandwiched between the first layer and the second layer and containing aluminum, nitrogen, and oxygen, wherein
a content of nitrogen in the intermediate layer decreases in the direction from the first layer toward the second layer,
a content of oxygen in the intermediate layer increases in the direction from the first layer toward the second layer, and
an X-ray diffraction pattern of the substrate does not have a peak derived from a crystal phase of aluminum oxynitride.

2. The substrate according to claim 1, wherein
a thickness of the intermediate layer is 10 nm or more and 1000 nm or less.

3. The substrate according to claim 1, wherein
the number of nitrogen atoms present in any one plane that is located within the substrate and substantially parallel to the first layer and the second layer is denoted as [N];
the number of oxygen atoms present in the any one plane is denoted as [O];
a first plane is defined as a plane where [N]/([O]+[N]) is 0.9;
a second plane is defined as a plane where [N]/([O]+[N]) is 0.1; and
the intermediate layer is a region between the first plane and the second plane.

4. The substrate according to claim 1, wherein the intermediate layer contains at least one selected from the group consisting of rare earth elements, alkaline earth elements, and alkali metal elements.

5. The substrate according to claim 1, wherein the intermediate layer contains at least one of europium and calcium.

6. A light-emitting element comprising the substrate according to claim 1.

7. The substrate according to claim 1, wherein the intermediate layer contains no aluminum oxynitride.

8. The substrate according to claim 1, wherein the intermediate layer is a layer in which α-alumina and aluminum nitride are mixed.

* * * * *